(12) United States Patent
Kharas

(10) Patent No.: US 10,224,457 B2
(45) Date of Patent: Mar. 5, 2019

(54) LIGHT EMITTING DEVICE WITH TRENCH BENEATH A TOP CONTACT

(71) Applicant: Lumileds LLC, San Jose, CA (US)

(72) Inventor: Boris Kharas, San Jose, CA (US)

(73) Assignee: Lumileds LLC, San Jose, CA (US)

(*) Notice: Subject to any disclaimer, the term of this patent is extended or adjusted under 35 U.S.C. 154(b) by 0 days.

(21) Appl. No.: 15/524,206

(22) PCT Filed: Nov. 5, 2015

(86) PCT No.: PCT/US2015/059170
§ 371 (c)(1),
(2) Date: May 3, 2017

(87) PCT Pub. No.: WO2016/073678
PCT Pub. Date: May 12, 2016

(65) Prior Publication Data
US 2017/0358707 A1  Dec. 14, 2017

Related U.S. Application Data

(60) Provisional application No. 62/076,013, filed on Nov. 6, 2014.

(51) Int. Cl.
*H01L 33/10* (2010.01)
*H01L 33/20* (2010.01)
(Continued)

(52) U.S. Cl.
CPC ............ *H01L 33/10* (2013.01); *H01L 33/06* (2013.01); *H01L 33/20* (2013.01); *H01L 33/46* (2013.01);
(Continued)

(58) Field of Classification Search
CPC ............... H01L 31/02002–31/02016; H01L 31/0224–31/022491;
(Continued)

(56) References Cited

U.S. PATENT DOCUMENTS 4,918,497 A   4/1990  Edmond
4,966,862 A   10/1990 Edmond
(Continued)

FOREIGN PATENT DOCUMENTS

CN  1983614 A   6/2007
CN  101615648 A  12/2009
(Continued)

OTHER PUBLICATIONS

EPO as ISA, "International Search Report and Written Opinion" dated Feb. 3, 2016 from International Application No. PCT/US2015/059170, filed Nov. 5, 2015, 11 pages.
(Continued)

*Primary Examiner* — Thanh Y Tran
(74) *Attorney, Agent, or Firm* — Volpe and Koenig, PC

(57) ABSTRACT

Embodiments of the invention are directed to structures in a vertical light emitting device that prevent light from being generated beneath absorbing structures, and/or direct light away from absorbing structures. Embodiments of the invention include a semiconductor structure including a light emitting layer disposed between an n-type region and a p-type region. A bottom contact is disposed on a bottom surface of the semiconductor structure. The bottom contact is electrically connected to one of the n-type region and the p-type region. A top contact is disposed on a top surface of the semiconductor structure. The top contact is electrically connected to the other of the n-type region and the p-type region. The top contact includes a first side and a second side opposite the first side. A first trench is formed in the semiconductor structure beneath the first side of the top contact. A second trench is formed in the seminconductor structure beneath the second side of the top contact.

16 Claims, 2 Drawing Sheets

(51) Int. Cl.
*H01L 33/06* (2010.01)
*H01L 33/46* (2010.01)
*H01L 33/00* (2010.01)
*H01L 33/40* (2010.01)

(52) U.S. Cl.
CPC ........ *H01L 33/0079* (2013.01); *H01L 33/405* (2013.01)

(58) Field of Classification Search
CPC . H01L 31/05–31/0516; H01L 51/441–51/445; H01L 29/8613; H01L 27/14678; H01L 31/034; H01L 29/862; H01L 2924/12038; H01L 31/0547–31/0549; H01L 31/056; H01L 33/10; H01L 33/06; H01L 33/46
See application file for complete search history.

(56) References Cited

U.S. PATENT DOCUMENTS

| | | |
|---|---|---|
| 5,027,168 A | 6/1991 | Edmond |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,789,768 A | 8/1998 | Lee et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,955,030 B2 | 10/2005 | Cullen |
| 6,995,030 B2 | 2/2006 | Illek et al. |
| 7,109,527 B2 | 9/2006 | Illek et al. |
| 7,135,709 B1 | 11/2006 | Wirth et al. |
| 7,547,921 B2 | 6/2009 | Illek et al. |
| 7,893,450 B2 | 2/2011 | Tazima et al. |
| 7,977,688 B2 | 7/2011 | Kim |
| 8,154,042 B2 | 4/2012 | Aldaz et al. |
| 8,476,666 B2 | 7/2013 | Kim et al. |
| 2002/0017652 A1 | 2/2002 | Illek et al. |
| 2002/0060316 A1 | 5/2002 | Matsuyama |
| 2002/0123164 A1 | 9/2002 | Slater, Jr. et al. |
| 2003/0006418 A1 | 1/2003 | Emerson et al. |
| 2003/0015721 A1 | 1/2003 | Slater, Jr. et al. |
| 2003/0141496 A1 | 7/2003 | Illek et al. |
| 2004/0084682 A1 | 5/2004 | Illek et al. |
| 2005/0184300 A1* | 8/2005 | Tazima ................... H01L 33/30 257/94 |
| 2005/0194603 A1 | 9/2005 | Slater, Jr. et al. |
| 2006/0145164 A1 | 7/2006 | Illek et al. |
| 2006/0180820 A1 | 8/2006 | Illek et al. |
| 2007/0069222 A1* | 3/2007 | Ko ........................... H01L 33/20 257/86 |
| 2007/0114550 A1 | 5/2007 | Kato et al. |
| 2009/0267096 A1 | 10/2009 | Kim |
| 2010/0078656 A1 | 4/2010 | Seo et al. |
| 2011/0241050 A1* | 10/2011 | Ye ........................... H01L 33/20 257/98 |
| 2011/0266568 A1 | 11/2011 | Aldaz et al. |
| 2012/0112161 A1* | 5/2012 | Aldaz ................... H01L 33/145 257/13 |

FOREIGN PATENT DOCUMENTS

| | | |
|---|---|---|
| EP | 1263058 A2 | 12/2002 |
| JP | S5867076 A | 4/1983 |
| JP | 61121373 A | 6/1986 |
| JP | 62277778 A | 12/1987 |
| JP | 6268252 A | 9/1994 |
| JP | 7106631 A | 4/1995 |
| JP | 7263743 A | 10/1995 |
| JP | 2004506331 A | 2/2004 |
| JP | 2007103725 A | 4/2007 |
| JP | 2009267418 A | 11/2009 |
| JP | 2010087515 A | 4/2010 |
| TW | 200905932 A1 | 2/2009 |
| TW | 201001760 A1 | 1/2010 |
| TW | 201007925 A1 | 2/2010 |
| WO | 0213281 A1 | 2/2002 |
| WO | 2008112064 A2 | 9/2008 |

OTHER PUBLICATIONS

T. Gessmann, et al. Entitled: "Omnidirectional Reflective Contacts for Light-Emitting Diodes". IEEE Electron Device Letters, vol. 24, No. 10, Oct. 2003. pp. 683-685.
K. Streubel, et al. Entitled: High Brightness AlGaInP Light-Emitting Diodes', IEEE Journal on Selected Topics in Quantum Electronics, vol. 8, No. 2, Mar./Apr. 2002. pp. 321-332.
R. Windisch, et al. Entitled: "InGaAlP Thinfilm LEDS With High Luminous Efficiency" OSRAM Opto Semiconductors, Wernerwerkstrasse 2, 93049 Regensburg, Germany, Light-Emitting Diodes: Research Manufacturing and Applications VIII, edited by Steve A. Stockman, H. Walter Yao, E. Fred Schubert, Proceedings of SPIE vol. 5366 (SPIE, Bellingham, WA 2004)-0277-786X/04/ $15—doi: 10.1117/12.528938, pp. 43-52.
EPO as ISA, PCT/IB2011/051417 filed Apr. 1, 2011, "International Search Report and Written Opinion", dated Jan. 31, 2012, 25 pages.
CN First Office Action dated Dec. 31, 2014, China Patent Application No. 201180021561.4, LUM Reference No. 2010P00577WOCN, 12 pages.
JP Office Action dated Feb. 16, 2015, Japan Patent Application No. 2013-506776, LUM Reference No. 2010P00577WOJP, 6 pages.
TW Office Action dated Aug. 21, 2015, Taiwan Patent Application No. 100111433, LUM Reference No. 2010P00577T1N, 9 pages.
CN Second Office Action dated Aug. 31, 2015, China Patent Application No. 201180021561.4, LUM Reference No. 2010P00577WOCN, 15 pages.
JP Office Action dated Nov. 4, 2015, Japan Patent Application No. 2013-506776, LUM Reference No. 2010P00577WOJP, 6 pages.
JP Decision to Refuse, dated Aug. 16, 2016, Japan Patent Application No. 2013-506776, LUM Reference No. 2010P00577WOJP, 6 pages.
TW Office Action dated Nov. 7, 2016, Taiwan Patent Application No. 105114597, LUM Reference No. 2010P0057711NO3, 7 pages.
KR Office Action dated Jan. 20, 2017, Korean Patent Application No. 10-2012-7031189, LUM Reference No. 2010P00577WOKR, 15 pages.

* cited by examiner

LIGHT EMITTING DEVICE WITH TRENCH BENEATH A TOP CONTACT

CROSS-REFERENCE TO RELATED APPLICATIONS

The present application is a § 371 application of International Application No. PCT/US2015/059170 filed on Nov. 5, 2015 and entitles "LIGHT EMITTING DEVICE WITH TRENCH BENEATH A TOP CONTACT", which claims the benefit of U.S. Provisional Patent Application No. 62/076,013, filed Nov. 6, 2014. International Application No. PCT/US2015/059170 and U.S. Provisional Patent Application No. 62/076,013 are incorporated herein.

FIELD OF THE INVENTION

The present invention relates to vertical thin film light emitting devices with trenches placed to direct light away from top contacts.

BACKGROUND

Light emitting diodes (LEDs) are widely accepted as light sources in many applications that require low power consumption, small size, and high reliability. Energy-efficient diodes that emit light in the yellow-green to red regions of the visible spectrum often contain active layers formed of a III-phosphide alloy.

FIG. 1 illustrates a portion of a vertical thin film III-phosphide device, described in more detail in US 2011/0266568, which is incorporated herein by reference. In a vertical device, contacts are formed on the top and bottom surface of the semiconductor structure. Current is injected by the contacts and travels in a vertical direction. One drawback of vertical architecture is that given the electrode configuration, current tends to flow directly underneath the top contact and generate light preferentially in the active region directly beneath the top contact. Light generated directly beneath the top contact is likely to be absorbed by the top contact, which may decrease optical extraction from the device.

FIG. 1 illustrates a portion of the device 500 under a top n-contact 35. The device includes an n-type region 50, a light emitting or active region 52, a p-type region 54, and a p-type contact layer 56.

A mirror 45 embedded in the semiconductor structure prevents light from being generated underneath or absorbed by n-contact 35. Mirror 45 is formed in a trench 44 etched in the semiconductor device, which may be etched through active region 52. The trench may be aligned with and have the same width as n-contact 35. Trench 44 may extend into n-type region 50. Deeper trenches form more effective mirrors; however, the depth of trench 44 is limited by the need to spread current through n-type region 50 and to maintain the structural integrity of the semiconductor structure during processing and operation. The width at the bottom of trench 44, which forms the mirror under n-contact 35, may be the same as the width of n-contact 35. Trench 44 may have angled or straight sidewalls. Sidewalls are angled 30° to 60° relative to a normal to the top surface of the semiconductor structure in some embodiments and 45° relative to a normal to the top surface of the semiconductor structure in some embodiments. Angled sidewalls may be formed, for example, by heating a photoresist mask such that it reflows to form a sloped sidewall. The shape of the sloped sidewall is transferred to the semiconductor by dry-etching.

Trench 44 and the top surface of p-type contact layer 56 are lined with a dielectric material 58 such as $SiO_2$ formed by, for example, plasma-enhanced chemical vapor deposition. Dielectric material 58 may be a single layer of material or multiple layers of the same or different materials. In some embodiments, the thickness of dielectric layer 58 is sufficient to ensure total internal reflection. The minimum necessary thickness for this effect is a fraction of an optical wavelength, and depends on the refractive index of the dielectric. For instance with a $SiO_2$ dielectric layer 58, a thickness of at least 50 nm would be suitable, and a thickness as large as one or several microns could be used.

Mirror 45 includes a reflective conductive layer 62 (often a reflective metal layer such as silver or aluminum) and a dielectric layer 58. The dielectric layer is positioned between the semiconductor structure and the reflective conductive layer 62 and also provides electrical isolation in some embodiments. Reflective layer 62 may be, for example, silver, and may be deposited by, for example, evaporation or sputtering. Reflective layer 62 may be a single layer of material or multiple layers of the same or different materials. In some embodiments the thickness of reflective layer 62 is between 1000 Å and 5000 Å.

Light emitted in the direction of n-contact 35 is reflected by mirror 45 away from n-contact 35. In some embodiments, the sides of mirror 45 are sloped to direct light toward the top surface of the device. Light incident on the mirror at large angles is totally internally reflected by dielectric layer 58. Light incident on the mirror at small angles passes through the dielectric layer and is reflected by reflective layer 62.

SUMMARY

It is an object of the invention to provide a vertical thin film device with a trench beneath a top contact, to direct light away from the top contact.

Embodiments of the invention include a semiconductor structure including a light emitting layer disposed between an n-type region and a p-type region. A bottom contact is disposed on a bottom surface of the semiconductor structure. The bottom contact is electrically connected to one of the n-type region and the p-type region. A top contact is disposed on a top surface of the semiconductor structure. The top contact is electrically connected to the other of the n-type region and the p-type region. A mirror is disposed directly beneath the top contact. The mirror includes a trench formed in the semiconductor structure and a reflective material disposed in the trench. The trench extends from the bottom surface of the semiconductor structure. The trench does not penetrate the light emitting layer.

Embodiments of the invention include a semiconductor structure including a light emitting layer disposed between an n-type region and a p-type region. A bottom contact is disposed on a bottom surface of the semiconductor structure. The bottom contact is electrically connected to one of the n-type region and the p-type region. A top contact is disposed on a top surface of the semiconductor structure. The top contact is electrically connected to the other of the n-type region and the p-type region. The top contact includes a first side and a second side opposite the first side. A first trench is formed in the semiconductor structure beneath the first side of the top contact. A second trench is formed in the semiconductor structure beneath the second side of the top contact.

DETAILED DESCRIPTION

Figure 1:
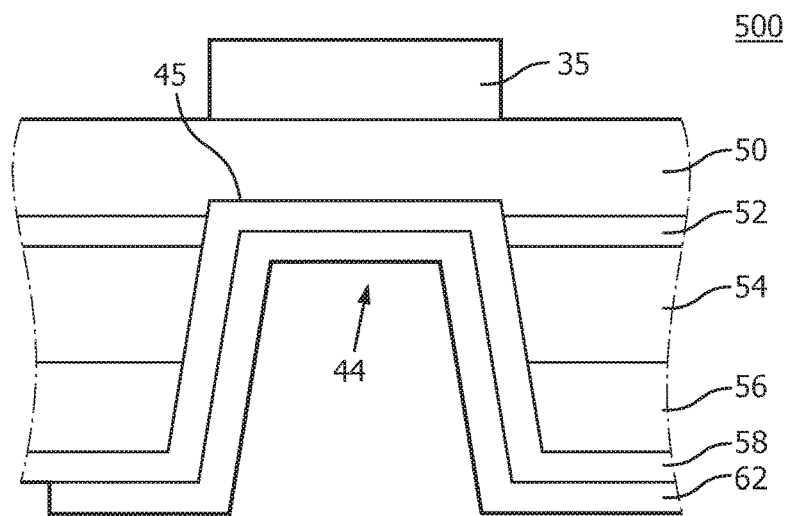
FIG. 1 illustrates a prior art III-phosphide device with a mirror formed in a trench.

In the structure illustrated in FIG. 1, the trench 44 cuts through the active region 52 of the semiconductor structure. The trench also creates a void space which is thermally insulating. Placing a thermally insulating void space immediately adjacent to an area of high current injection and high temperature may reduce the efficiency of the device, or cause device failure. Finally, the trench 44 reduces the thickness of the semiconductor structure, increasing the possibility that the semiconductor structure could crack.

Embodiments of the invention are directed to structures in a vertical light emitting device that prevent light from being generated beneath absorbing structures such as the top n-contact, and/or direct light away from absorbing structures, without suffering from the drawbacks of the FIG. 1 structure described above.

Depending on the context, as used herein, "AlGaInP" or "AlInGaP" may refer in particular to a quaternary alloy of aluminum, indium, gallium, and phosphorus, or in general to any binary, ternary, or quaternary alloy of aluminum, indium, gallium, and phosphorus. "III-nitride" may refer to a binary, ternary, or quaternary alloy of any group III atom (such as aluminum, indium, and gallium) and nitrogen. Depending on the context, as used herein, "contact" may refer in particular to a metal electrode, or in general to the combination of a semiconductor contact layer, a metal electrode, and any structures disposed between the semiconductor contact layer and the metal electrode. Though in the examples below the semiconductor light emitting device are AlInGaP LEDs, semiconductor light emitting devices besides LEDs such as laser diodes and semiconductor light emitting devices made from other materials systems such as other III-V materials, III-nitride, III-phosphide, III-arsenide, II-VI materials, ZnO, or Si-based materials may be used.

Figure 2:
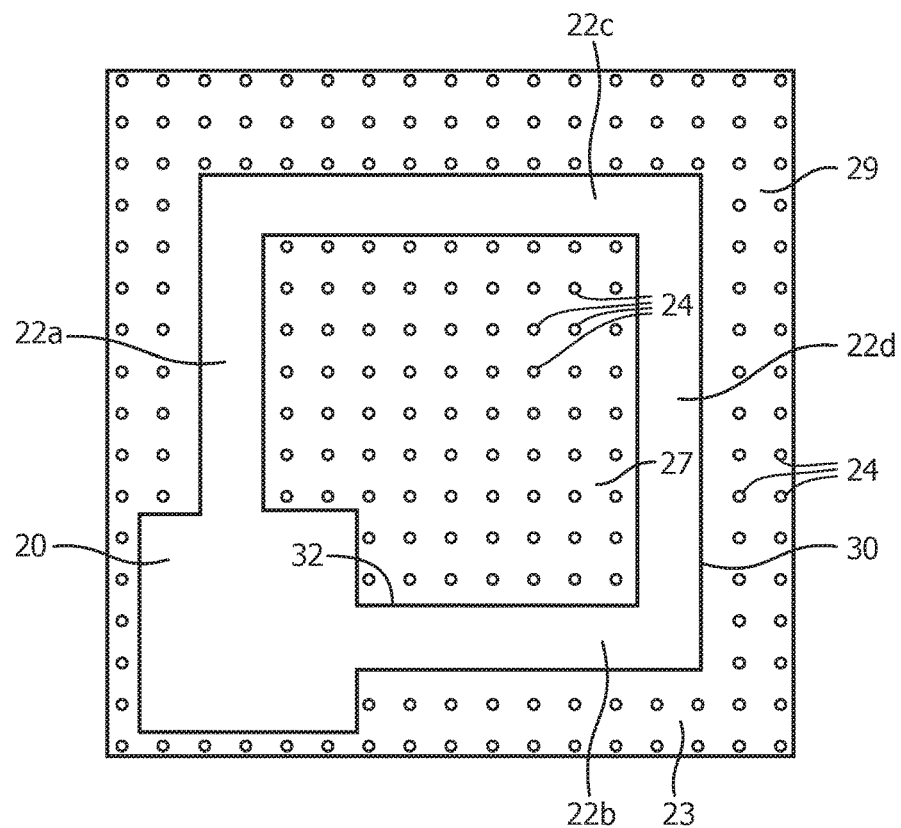
FIG. 2 illustrates the arrangement of n- and p-contacts in a vertical thin film device according to embodiments of the invention.

FIG. 2 illustrates the arrangement of n- and p-contacts in a vertical AlInGaP device according to embodiments of the invention. The n-contact structures are formed on the top surface of the device the surface from which a majority of light is extracted from the device. The p-contact structures are formed on the bottom surface of the device—the surface opposite the top surface.

The n-contact includes a large contact pad 20, and one or more narrower contact arms 22. In the configuration illustrated in FIG. 2, the n-contact pad is positioned near the lower left hand corner of the structure. The device includes four contact arms 22a, 22b, 22c and 22d collectively contacts arms 22. Two contact arms 22a and 22b extend from the contact pad 20 to connect with the other two contact arms 22c and 22d to form a square.

The p-contact structures are formed on the bottom surface of the device. Because a majority of light is extracted from the device through the top surface, light emitted in the direction of the bottom surface is preferably reflected toward the top surface. However, the materials typically used for p-contacts in AlInGaP devices are absorbing, not reflective. Accordingly, in order to minimize the area of the p-contact, the p-contact is distributed over many small areas 24. The bottom surface of the device 23 between the p-contact areas 24 is made reflective. P-contact areas 24 are formed in an area 27 inside the square formed by the n-contact arms 22a, 22b, 22c, and 22d, and in an area 29 outside the square formed by the re-contact arms 22. The n-contact arms 22a, 22b, 22c, and 22d have an inner wall 32 and an outer wall 30, described below.

Figure 3:
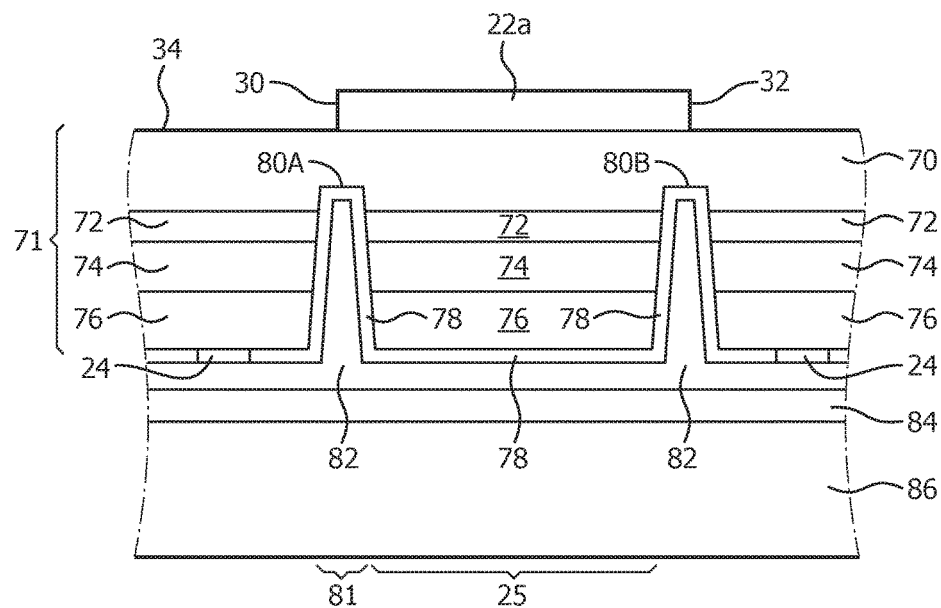
FIG. 3 is a cross section of a portion of a device including two trenches disposed beneath the n-contact.
Figure 4:
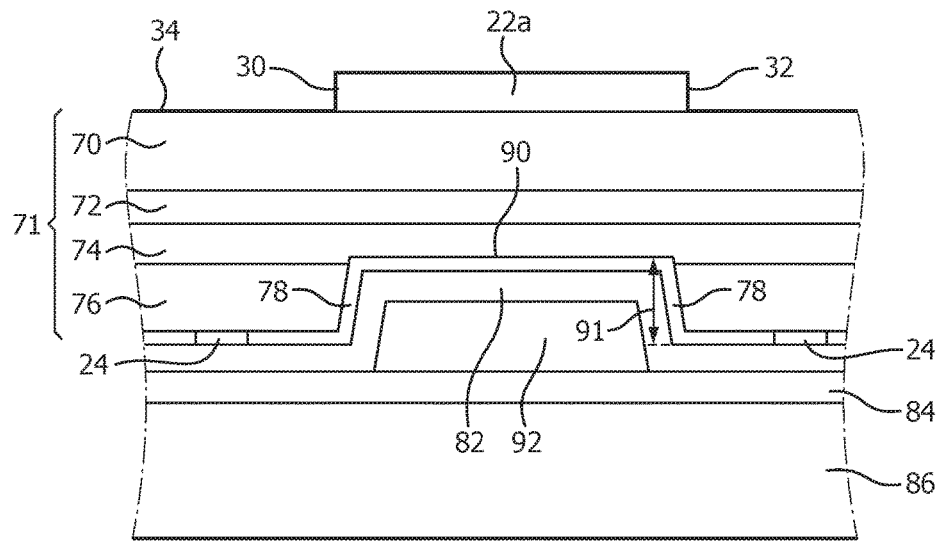
FIG. 4 is a cross section of a portion of a device including a shallow trench disposed beneath the n-contact.

FIGS. 3 and 4 are cross sectional views of portions of AlInGaP devices according to some embodiments. The region of an n-contact arm 22a is illustrated in FIGS. 3 and 4. In the device of FIG. 3, two narrow trenches are formed beneath the n-contact arm 22a, rather than a single, wide trench as illustrated in FIG. 1. In the device of FIG. 4, a wide, shallow trench is formed beneath the n-contact arm 22a, rather than a wide, deep trench as illustrated in FIG. 1. Though n-contact arm 22a is illustrated in FIGS. 3 and 4, the structures illustrated may be formed beneath any of the other n-contact arms 22b, 22c, and 22d. The devices illustrated in FIGS. 3 and 4 are formed as follows. A semiconductor device structure 71 is grown over a growth substrate (not shown). The growth substrate is often GaAs, though any suitable growth substrate may be used. An etch stop layer (not shown) is grown over the growth substrate. The etch stop layer may be any material that may be used to stop an etch used to later remove the growth substrate. The etch stop layer may be, for example, InGaP, AlGaAs, or AlGaInP. The material of the etch stop layer may be lattice-matched to the growth substrate (typically GaAs), though it need not be. Etch stop layers that are not lattice matched to the growth substrate may be thin enough to avoid relaxation and/or may be strain compensated. The thickness of the etch stop layer depends on the selectivity of the etch solutions used to remove the GaAs substrate; the less selective the etch, the thicker the etch stop layer. An AlGaAs etch stop layer may be, for example, between 2000 and 5000 Å, though a thicker etch stop layer may be used if the etch stop layer is used to texture the emitting surface of the device, as described below. The composition x of an $Al_xGa_{1-x}As$ etch stop layer may be, for example, between 0.50 and 0.95.

The device layers 71, including at least one light emitting layer in a light emitting region sandwiched between an n-type region and a p-type region, are grown over the etch stop layer, starting with n-type region 70. The thickness and doping concentration of n-type region 70 are selected for low electrical resistance and good current distribution. For example, n-type region 70 may include an AlGaInP layer at least 1 µm in some embodiments, no more than 10 µm thick in some embodiments, at least 3 µm thick in some embodiments, and no more than 5 µm thick in some embodiments. The AlGaInP layer may be doped with Te or Si to a concentration of at least $5 \times 10^{17}$ cm$^{-3}$ in some embodiments and no more than $5 \times 10^{18}$ cm$^{-3}$ in some embodiments. An AlGaInP n-type region 70 is usually lattice-matched to GaAs. At higher dopant concentrations, the same current distribution may be achievable with a thinner layer; however, undesirable free carrier absorption may increase at higher dopant concentrations. N-type region 70 may therefore include a non-uniform doping concentration, such as one or more thick regions doped to a concentration of at least $5 \times 10^{17}$ cm$^{-3}$ in some embodiments and no more than $5 \times 10^{18}$ cm$^{-3}$ in some embodiments, and one or more thin regions that are doped more heavily, up to, for example, $1 \times 10^{19}$ cm$^{-3}$. These highly doped regions may be doped with Te, Si, S, or other suitable dopants, and the high doping concentration can be achieved either by epitaxial growth, by dopant diffusion, or both. In one example, the composition of n-type region 70 in a device with a light emitting region configured to emit red light is $(Al_{0.04}Ga_{0.60})_{0.5}In_{0.5}P$ A light emitting or active region 72 is grown over n-type region 70. Examples of suitable light emitting regions include a single light emitting layer, and a multiple quantum well light emitting region, in which multiple thick or thin light emitting wells are separated by barrier layers. In one example, the light emitting region 72 of a device configured to emit red light includes $(Al_{0.06}Ga_{0.94})_{0.5}In_{0.5}P$ light emitting layers separated by $(Al_{0.65}Ga_{0.35})_{0.5}In_{0.5}P$ barriers. The light emitting layers and the barriers may each have a thickness between, for example, 20 and 200 Å. The total thickness of the light emitting region may be, for example, between 500 Å and 3 µm.

A p-type region 74 is grown over light emitting region 72. P-type region 74 is configured to confine carriers in light emitting region 72. In one example, p-type region 74 is $(Al_{0.65}Ga_{0.35})_{0.5}In_{0.5}P$ and includes a thin layer of high Al composition to confine electrons. The thickness of p-type region 74 may be on the order of microns; for example, between 0.5 and 3 µm. The proximity of the light emitting layers of the light emitting region to the p-contact through a thin p-type region 74 may also reduce the thermal impedance of the device.

A p-type contact layer 76 is grown over p-type region 74. P-type contact layer 76 may be highly doped and transparent to light emitted by the light emitting region 72. For example, p-type contact layer 76 may be doped to a hole concentration of at least $5 \times 10^{18}$ cm$^{-3}$ in some embodiments, and at least $1 \times 10^{19}$ cm$^{-3}$ in some embodiments. In this case, p-type contact layer 76 may have a thickness between 100 Å and 1000 Å. If the p-type contact layer 76 is not highly doped then the thickness may be increased to as much as 2 µm. P-type contact layer 76 may be GaP or any other suitable material.

In some embodiments, p-type contact layer 76 is highly doped GaP. For example, a GaP contact layer 76 grown by metal organic chemical vapor deposition may be doped with Mg or Zn, activated to a hole concentration of between $5 \times 10^{17}$ and $5 \times 10^{18}$ cm$^{-3}$. The GaP layer may be grown at low growth temperature and low growth rate; for example, at growth temperatures approximately 50 to 200° C. below typical GaP growth temperatures of ~850° C., and at growth rates of approximately 1% to 10% of typical GaP growth rates of ~5 µm/hr. A GaP contact grown by molecular beam epitaxy may be doped with C to a concentration of at least $1 \times 10^{19}$ cm$^{-3}$.

As an alternative to incorporating dopants during growth, the p-type contact layer 76 may be grown, then the dopants may be diffused into the p-type contact layer from a vapor source after growth, for example by providing a high pressure dopant source in a diffusion furnace or in the growth reactor, as is known in the art. Dopants may be diffused from a vapor source into the entire area of the surface of p-type contact layer 76, or in discrete regions of p-type contact layer 76, for example by masking parts of p-type contact layer 76 with, for example, a dielectric layer, prior to dopant diffusion.

In some embodiments, p-type contact layer 76 is a highly doped GaP or lattice-matched AlGaInP layer. The layer is doped by growing the semiconductor material, then depositing a layer, including a dopant source, over the grown layer. For example, the dopant source layer may be elemental Zn, a AuZn alloy, or a doped dielectric layer. The layer including the dopant source may optionally be capped with a diffusion blocking layer. The structure is annealed such that the dopants diffuse into the semiconductor from the dopant source layer. The diffusion blocking layer and remaining dopant source layer may then be stripped off. In one example, 3000 Å to 5000 Å of a AuZn alloy containing 4% Zn is deposited over a GaP layer, followed by a TiW diffusion blocking layer. The structure is heated, then the remaining TiW and AuZn are stripped. In another example, the patterned AuZn layer is left in place as the contact metal in p-contact areas 24 shown in, for example, FIGS. 3 and 4.

In some embodiments, p-type contact layer 76 is highly doped InGaP or AlGaInP layer that is not lattice-matched to GaAs. The layer may be between 100 Å and 300 Å thick and doped with Mg or Zn to a hole concentration of at least $1 \times 10^{19}$ cm$^{-3}$.

In some embodiments, the order of the semiconductor layers illustrated in FIGS. 3 and 4 is reversed. In such a device, referred to as an inverted architecture device, the top contact arms 22a-22d and contact pad 20 are formed on the p-type contact layer 76, such that a majority of light is extracted through the p-type contact layer 76 on the top of the device. The bottom contact is electrically connected to the n-type region 70. In an inverted architecture device, a GaP or other suitable p-type contact layer 76 may be grown thicker, for example to a thickness between 10 and 15 µm, in order to enable current spreading across longer distances. Either of the devices illustrated in FIGS. 3 and 4 may be formed with an inverted architecture. Though in the description below, contact arm 22a is referred to as n-contact arm 22a, in an inverted architecture device, the illustrated contact arm 22a would be part of the p-contact.

The trenches illustrated in FIGS. 3 and 4 are then formed.

In FIG. 3, two narrow trenches 80A and 80B are formed on either side, or slightly overlapping the sides, of the n-contact arms 22a-22d. In some embodiments, a single narrow trench (i.e. only one of trenches 80A or 80B), or two narrow trenches as illustrated in FIG. 3, are formed beneath the outer edge of the n-contact pad 20. The full thickness of the semiconductor structure 71 is left between trenches 80A and 80B, which may improve the strength of the structure and reduce failure from cracking in areas where the trenches are formed. In some embodiments, as illustrated in FIG. 3, trenches 80A and 80B extend through the p-type layers 74 and 76 and through active region 72. In some embodiments, the deepest part of trenches 80A and 80B is in the n-type region 70. The depth of trenches 80A and 80B is limited by the need to spread current through n-type region 70 and to maintain the structural integrity of the semiconductor structure during processing and operation. In some embodiments, trenches 80A and 80B are shallower than illustrated in FIG. 3, such that they extend only into active region 72, or only into p-type region 74 or 76. Trenches 80A and 80B may be aligned beneath the outer wall 30 and the inner wall 32 of n-contact arms 22a-22d in some embodiments. In some embodiments, trenches 80A and 80B are positioned so that they are inside or outside the edges of the contact arms 22a-22d.

In various embodiments, trenches 80A and 80B may have angled or straight sidewalls. Sidewalls are angled 30° to 90° relative to a normal to the top surface of the semiconductor structure in some embodiments and 45° relative to a normal to the top surface of the semiconductor structure in some embodiments. Angled sidewalls may be formed, for example, by heating a photoresist mask such that it reflows to form a sloped sidewall. The shape of the sloped sidewall is transferred to the semiconductor by dry-etching.

The width 81 of trenches 80A and 80B is defined at the bottom surface of the semiconductor structure. The width is chosen such that the sum of the two trench 80A and 80B widths 81, plus the gap 25 between the trenches 80A and 80B, is approximately equal to the width of the contact arm (2×81+25≈22a). The minimum width 81 of the trench depends on the lithographic and etch capabilities but may be at least 0.5 µm wide in some embodiments and no more than 10 µm wide in some embodiments. In general, smaller trench widths 81 are desirable. The width at the top of the trench in the orientation illustrated in FIG. 3 depends on the etch angle that is chosen. In some embodiments where the contact arms 22a-22d width is 20 µm, each trench may be 5 µm wide at the bottom (width 81), and the gap 25 may be 10 µm. In other embodiments the gap may be smaller, such as 5 µm for example, such that the trenches are disposed inside the profile (i.e. inside the edges) of contact arms 22a-22d. In other embodiments the gap may be wider, such as 20 µm for example, so that the trenches are disposed outside the profile (i.e. outside the edges) of contact arms 22a-22d. The gap 25 is chosen to be as large as possible to maximize the amount of semiconductor 71 that remains at the bottom surface of the semiconductor structure.

In FIG. 4, a single, wide, shallow trench 90 is formed beneath n-contact arms 22a-22d. In some embodiments, a single narrow trench, or a wide, shallow trench as illustrated in FIG. 4, is formed beneath the outer edge of the n-contact pad 20. The width at the deepest point of trench 90 may be the same as the width of n-contact arm 22a, to prevent light from being generated directly underneath the n-contact arm 22. The width of contact arms 22a-22d is chosen to optimize current spreading within the semiconductor layers of the LED, while at the same time minimizing excessive width that may block light emission from the semiconductor. In practical terms the minimum width is determined by the lithographic and process limitations. Contact arms 22a-22d may be at least 5 µm wide in some embodiments, and no more than 50 µm wide in some embodiments. The width of trench 90 maybe the same width as contact arm 22a, or slightly smaller or larger. In some embodiments, the width of trench 90 may be plus or minus 10% of the width of contact arm 22a. For example, if the contact arm 22a is 20 µm wide, the trench 90 may be between 18 µm and 22 µm wide.

In some embodiments, trench 90 extends through p-type contact layer 76 and into p-type region 74 as illustrated in FIG. 4. In some embodiments, trench 90 is deeper or shallower than illustrated in FIG. 4. In some embodiments, the trench extends from the bottom surface of the semiconductor structure and does not penetrate the light emitting layer. Shallower trenches permit better current spreading and better structural integrity of the semiconductor structure during processing and operation. Trench 90 may have a depth 91 of at least 0.5 µm in some embodiments, and no more than and 5 µm in some embodiments. The depth of trench 90 may be determined by the thickness of the semiconductor layers present. For example, a trench that extends through active region 72, or into the n-type layer 70, may be deeper than a trench that does not extend through active region 72.

After forming the trenches, trenches 80A and 80B or trench 90, and the top surface of p-type contact layer 76, are lined with a dielectric material 78. Dielectric material 78 may be any suitable material formed by any suitable technique. Dielectric material 78 may be, for example, $SiO_2$ formed by, for example, plasma-enhanced chemical vapor deposition. Dielectric material 78 may be a single layer of material or multiple layers of the same or different materials. In some embodiments, the thickness of dielectric layer 78 is sufficient to ensure total internal reflection (TIR) of light incident on the dielectric layer. The minimum necessary thickness for TIR is a fraction of an optical wavelength, and depends on the refractive index of the dielectric. For example, with a $SiO_2$ dielectric layer 78, a thickness of at least 50 nm would be suitable, and a thickness as large as one or several microns could be used.

Small holes are etched in dielectric layer 78 where electrical contact to p-type contact layer 76 is desired. In FIG. 3, to prevent light from being generated between trenches 80A and 80B, where it is likely to be absorbed by n-contact arm 22, no p-contact openings are formed in the dielectric 78 between trenches 80A and 80B. In FIG. 4, no p-contact openings are formed beneath n-contact arm 22a. Accordingly, no light is generated by the active region 72 beneath n-contact arm 22a. The p-contact holes are filled with a contact metal to form p-contacts 24. The contact metal may be formed by, for example, sputtering of AuZn and a lift-off process. The etching of the small holes on dielectric 78 and lift-off of the metal contact may be performed with a single photoresist mask resulting in a self-aligned processes. In some embodiments, the small holes 24 in dielectric 78 filled with contact metal are between 1 µm and 10 µm in diameter with a total coverage percentage between 1% to 10% of the top surface of the p-type contact layer 76.

A reflective layer 82 is formed on dielectric layer 78 and p-contacts 24. Reflective layer 82 lines the trenches. Reflective layer 82 may fill the trenches, as illustrated in FIG. 3, though it need not, as illustrated in FIG. 4. Reflective layer 82 may be, for example, silver, and may be deposited by, for example, evaporation or sputtering. Reflective layer 82 may be a single layer of material or multiple layers of the same or different materials. In some embodiments the thickness of reflective layer 82 is between 1000 Å and 5000 Å. The reflective layer 82 is electrically conductive and makes electrical contact with the p-contact metal in the regions 24 where the contact metal is formed.

The reflective layer 82 may be patterned as is known in the art to remove reflective layer from areas where it is not wanted, such as the edges of the device. A guard material (not shown) such as, for example, TiW may be formed over the reflective layer 82 and next to the reflective layer 82 at the edges of the device. The guard material may seal the reflective layer in place, which may reduce or prevent problems such as electromigration or oxidation of a silver reflective layer 82. The guard material may be a single layer of material or multiple layers of the same or different materials. The guard material may be electrically conductive in some embodiments.

One or more bonding layers 84 are disposed between the device and the mount 86. One bonding layer may be formed on reflective metal 82, and one bonding layer may be formed on mount 86.

A bonding layer 84 formed over the reflective metal 82 may be, for example, Au or Ag, or a solder Alloy such as AuIn or AuSn alloy, and may be formed by, for example, evaporation or sputtering. Each bonding layer 84 may be a single layer of material or multiple layers of the same or different materials. In embodiments where the reflective metal 82 does not completely fill the trenches, the bonding layer material or another material may be deposited to fill the void spaces in the trenches 80A and 80B or to fill the void space 92 in trench 90.

The device is then connected to a mount 86 through bonding layers 84. (The bonding layers maybe applied to the device wafer and/or to the mount wafer before bonding.) Mount 86 may be selected to have a coefficient of thermal expansion (CTE) that is reasonably closely matched to the CTE of the semiconductor layers. Mount 86 may be, for example, GaAs, Si, Ge, a metal such as molybdenum, or any other suitable material. The bonding layer formed on mount 86 may be, for example, Au or any other suitable material. A bond is formed between the two bonding layers by, for example, thermocompression bonding, or any other suitable technique. Electrical contact to the p-type region is made, for example, through a contact (not shown) on the bottom of mount 86. Mount 86 may be conductive or may include a conductive region or trace that electrically connects the contact on the bottom to p-contacts 24 through reflective conductive layer 82, bonding layers 84, and any intervening layers. As an alternative to bonding the device to the mount, a thick mount can be grown on the device wafer by, for example, electroplating techniques.

After attaching the device to the mount, the growth substrate (not shown) is removed by a technique suitable to the growth substrate material. For example, a GaAs growth substrate may be removed by a wet etch that terminates on an etch-stop layer grown over the growth substrate before the device layers. The semiconductor structure may optionally be thinned N-contact metal, such as, for example, Au/Ge/Au or any other suitable contact metal or metals, may be deposited then patterned to form n-contact arms 22a-22d and bonding pad 20. The structure may be heated, for example to anneal n-contacts 20 and 22a-22d and/or p-contacts 24. The surface 34 of n-type region 70 exposed by removing the growth substrate may be roughened to improve light extraction, for example by photoelectrochemical, plasma etching, or patterned by, for example, nanoimprint lithography to form a photonic crystal or other light scattering structure. In other embodiments, a light-extracting feature is buried in the structure. The light extracting feature may be, for example, a variation in index of refraction in a direction parallel to the top surface of the device (i.e. perpendicular to the growth direction of the semiconductor layers). In some embodiments, the surface of the p-type contact layer may be roughened or patterned prior to forming dielectric layer 78. In some embodiments, before or during growth of the semiconductor structure, a layer of low index of material is deposited on the growth substrate or on a semiconductor layer and patterned to form openings in the low index material or posts of low index material. Semiconductor material is then grown over the patterned low index layer to form a variation in index of refraction that is disposed within the semiconductor structure.

A wafer of devices may then be tested and singulated into individual devices. Individual devices may be placed in packages, and an electric contact such as a wire bond may be formed on the bonding pad 20 of the device to connect the n-contact to a part of the package such as a lead.

In operation, current is injected in the p-type region by contacts 24 via the mount 86. Current is injected in the n-type region by bonding pad 20, on the top surface of the device. Current is injected from bonding pad 20 to n-contact arms 22a-22d into n-type region 70.

When the active region 72 is emitting light, light incident on the sidewalls of the trenches 80A, 80B, and 90 at large angles is totally internally reflected by dielectric layer 78. Light incident on the sidewalls of the trenches 80A, 80B, and 90 at small angles passes through the dielectric layer 78 and is reflected by reflective layer 82. The trenches direct light away from n-contact arms 22. Trenches may similarly be formed beneath n-contact pad 20, to direct light away from n-contact pad 20. The trenches, the dielectric material disposed in the trenches, and the reflective material disposed on the dielectric material, form mirrors to direct light away from one or both of the n-contact pad 20 and n-contact arms 22a-22d.

The devices illustrated in FIGS. 3 and 4 are thin film devices, meaning that the growth substrate is removed from the final device. The total thickness between the top contact and the top surface of the bonding layers that connect the device to the mount in the thin film devices described above is no more than 20 microns in some embodiments and no more than 15 microns in some embodiments The structures described herein may offer advantages.

For example, replacing the large wide void space of the trench of FIG. 1 with electrically isolated semiconductor material between two trenches 80A and 80B as illustrated in FIG. 3 may create a more mechanically robust structure, reducing opportunities for cracking of the semiconductor structure during processing and/or operation. In addition, replacing the single wide mirror trench of FIG. 1 with a double trench structure on either side of the n-contact as illustrated in FIG. 3 may improve light extraction by creating additional surfaces for light reflection. The double trench structure of FIG. 3 still serves the original purpose of the FIG. 1 structure preventing light generation beneath the n-contact by blocking current injection and by redirecting light away from optical dead space beneath the n-contact.

Replacing a deep trench that extends through the active region as in FIG. 1 with a shallower trench that does not extend through the active region as illustrated in FIG. 4 may improve reliability by removing opportunities for defects or contaminants to be introduced into the active layer. The shallow trench structure of FIG. 4 still serves the original purpose of the FIG. 1 structure—preventing light generation beneath the n-contact by blocking current injection and by redirecting light away from optical dead space beneath the n-contact.

Finally, replacing the thermally resistant void space of the wide, deep trench of FIG. 1 with semiconductor material in both FIGS. 3 and 4 may create a thermal conduction path from the n-contact arms 22a-22d to the mount 86, for heat generated in the n-contact arms 22a-22d. This may improve the efficiency of the device.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A device comprising:
   a semiconductor structure comprising a light emitting layer disposed between an upper region having a first conductivity and a lower region having a second conductivity opposite the first conductivity;
   a top contact disposed on a top surface of the semiconductor structure, the top contact being electrically connected to the upper region;
   a mount:
   a trench formed in a bottom surface of the semiconductor structure beneath the top contact, the trench extending from the bottom surface without penetrating the light emitting layer, the trench creating a thermal conduction path from an n-contact arm to the mount, and comprising a first sidewall extending from a top of the trench to a bottom of the trench such that the entire first sidewall is angled less than 90° relative to a normal to the top surface of the semiconductor structure;

a reflective layer disposed over the bottom surface and in the trench, the reflective layer in the trench forming at least part of a mirror that reflects light away from the top contact; and a filler material disposed in a void where the reflective layer does not completely fill the trench.

2. The device of claim 1 wherein the trench is aligned with and disposed beneath the top contact and at least a portion of the trench is substantially the same width as the top contact overlying the trench.

3. The device of claim 1 wherein the light emitting layer is a III-nitride material.

4. The device of claim 1 wherein the light emitting layer is AlInGaP.

5. The device of claim 1 further comprising a dielectric layer lining the bottom surface and the trench, the dielectric layer in the trench forming part of the mirror that reflects light away from the top contact, the reflective layer being disposed on the dielectric layer over the bottom surface and in the trench, the reflective layer being electrically isolated from the semiconductor structure by the dielectric layer.

6. The device of claim 5 further comprising contact metals in the dielectric layer to electrically contact the bottom surface, the reflective layer being electrically conductive and in electrical contact with the contact metals.

7. The device of claim 1 wherein the first sidewall is angled 30° to 90° relative to a normal to the top surface of the semiconductor structure.

8. The device of claim 1 wherein:
The upper region is an n-type region;
the top contact is electrically connected to the n-type region;
the lower region is a p-type region; and
a deepest point of the trench is disposed in the p-type region.

9. The device of claim 1 wherein:
the upper region is a p-type region;
the top contact is electrically connected to the p-type region;
the lower region is an n-type region; and
a deepest point of the trench is disposed in the n-type region.

10. A device comprising:
a semiconductor structure comprising a light emitting layer disposed between an upper region having a first conductivity and a lower region having a second conductivity opposite the first conductivity;
a top contact disposed on a top surface of the semiconductor structure, the top contact being electrically connected to the upper region, the top contact comprising a first edge and a second edge opposite the first edge;
first trench formed in a bottom surface of the semiconductor structure beneath the first edge of the top contact;
second trench formed in the bottom surface of the semiconductor structure beneath the second edge of the top contact;
a mount:
the first trench and the second trench creating a thermal conduction path from an n-contact arm to the mount; and
a dielectric layer lining the bottom surface, the first trench, and the second trench, the dielectric layer in the first trench and the second trench forming at least part of mirrors that reflect light away from the top contact.

11. The device of claim 10 further comprising a reflective layer disposed on the dielectric layer over the bottom surface and in the first trench and the second trench, the reflective layer in the first trench and second trench forming part of the mirrors that reflect light away from the top contact, the reflective layer being electrically isolated from the semiconductor structure by the dielectric layer.

12. The device of claim 11 further comprising contact metals in the dielectric layer to electrically contact the bottom surface, the reflective material being electrically conductive and in electrical contact with the contact metals.

13. The device of claim 10 wherein:
the upper region is an n-type region; and
first trench and the second trench each extend from the bottom surface and a deepest point of each of the first and second trenches is within the n-type region.

14. The device of claim 10 wherein the light emitting layer is a III-nitride material.

15. The device of claim 10 wherein at least one sidewall of each of the first and second trenches is angled 30° to 90° relative to a normal to the top surface of the semiconductor structure.

16. The device of claim 10 further comprising a filler material disposed in voids where the reflective layer does not completely fill the first trench and the second trench.

* * * * *